United States Patent
Jaus et al.

(10) Patent No.: US 8,217,257 B2
(45) Date of Patent: Jul. 10, 2012

(54) SOLAR CELL MODULE AND METHOD FOR ITS PRODUCTION

(75) Inventors: Joachim Jaus, Freiburg (DE); Andreas Bett, Freiburg (DE); Armin Boesch, Ehrenklrchen (DE); Frank Dimroth, Freiburg (DE); Hansjoerg Lerchenmueller, Freiburg (DE)

(73) Assignee: Fraunhofer-Gesellschaft zur Förderung der Angewandten Forschung E.V. (DE)

( * ) Notice: Subject to any disclaimer, the term of this patent is extended or adjusted under 35 U.S.C. 154(b) by 134 days.

(21) Appl. No.: 11/997,189

(22) PCT Filed: Jul. 28, 2006

(86) PCT No.: PCT/EP2006/007500
§ 371 (c)(1),
(2), (4) Date: Apr. 14, 2008

(87) PCT Pub. No.: WO2007/014716
PCT Pub. Date: Feb. 8, 2007

(65) Prior Publication Data
US 2008/0230109 A1    Sep. 25, 2008

(30) Foreign Application Priority Data
Jul. 29, 2005  (DE) .......................... 10 2005 035 672

(51) Int. Cl.
*H02N 6/00*  (2006.01)
*H01L 31/042*  (2006.01)
(52) U.S. Cl. ........................................ 136/244; 136/246
(58) Field of Classification Search .................. 136/244, 136/246
See application file for complete search history.

(56) References Cited

U.S. PATENT DOCUMENTS

| 4,019,924 A | * | 4/1977 | Kurth ............................ 136/251 |
| 4,131,755 A | | 12/1978 | Keeling et al. |
| 4,173,820 A | | 11/1979 | Mueller et al. |

(Continued)

FOREIGN PATENT DOCUMENTS
DE    3520423 A1    11/1986
(Continued)

OTHER PUBLICATIONS

Definition of radial <www.thefreedictionary.com/radially>. accessed Oct. 6, 2010.*

(Continued)

*Primary Examiner* — Basia Ridley
*Assistant Examiner* — Allison Bourke
(74) *Attorney, Agent, or Firm* — Young Basile

(57) ABSTRACT

A solar cell module and a method for the production thereof, are used in particular in the field of concentrating solar technology. The solar cell module has a large number of two-dimensionally disposed solar cells. These solar cells are applied on a substrate which is coated with a metal layer on the surface orientated towards the solar cells. The metal layer is thereby structured in such a manner that it is subdivided into individual two-dimensional portions which are assigned respectively to one solar cell. The metal layer in each of the portions has two regions which are electrically insulated from each other, the first region extending under the assigned solar cell and contacting the latter in an electrically conductive manner. The second region is likewise connected to the other electrical contact of the solar cell. In order to produce a parallel and series circuit of the individual solar cells, the individual portions of the metal layer are now connected to each other in a suitable manner by means of connecting portions which, for their part, are part of the metal layer.

26 Claims, 7 Drawing Sheets

U.S. PATENT DOCUMENTS

| | | | |
|---|---|---|---|
| 4,191,593 A | | 3/1980 | Cacheux |
| 4,337,759 A | * | 7/1982 | Popovich et al. ............. 126/684 |
| 4,354,115 A | * | 10/1982 | Warabisako et al. ......... 250/551 |
| 4,536,607 A | * | 8/1985 | Wiesmann .................... 136/249 |
| 4,746,371 A | | 5/1988 | McLeod et al. |
| 4,776,893 A | | 10/1988 | McLeod et al. |
| 4,834,805 A | * | 5/1989 | Erbert ........................... 136/246 |
| 4,836,861 A | | 6/1989 | Peltzer |
| 4,892,593 A | * | 1/1990 | Lew .............................. 136/246 |
| 5,091,018 A | | 2/1992 | Fraas et al. |
| 5,118,361 A | * | 6/1992 | Fraas et al. ................... 136/246 |
| 5,344,497 A | | 9/1994 | Fraas et al. |
| 5,430,616 A | * | 7/1995 | Katsu et al. .................. 361/809 |
| 6,248,949 B1 | | 6/2001 | Turner |
| 6,353,175 B1 | * | 3/2002 | Fraas ............................ 136/255 |

FOREIGN PATENT DOCUMENTS

| | | |
|---|---|---|
| EP | 0657948 A2 | 6/1995 |
| WO | 91/18419 | 11/1991 |
| WO | 9118419 A1 | 11/1991 |

OTHER PUBLICATIONS

Office Action dated Nov. 17, 2008 from corresponding Chinese Application No. 200680027507.X.

Korean Patent Office Action dated Jan. 13, 2012 from the parallel Korean Application No. 10-2008-7002490.

International Search Report dated Oct. 20, 2006.

* cited by examiner

SOLAR CELL MODULE AND METHOD FOR ITS PRODUCTION

BACKGROUND OF THE INVENTION

The present invention relates to a solar cell module and to a method for the production thereof. Solar cell modules of this type are used in particular in the field of concentrating solar technology.

In photovoltaics, a plurality of solar cells are combined together to form larger modules. Within one module, a plurality of solar cells are wired up together, the module takes over further tasks in addition, such as e.g. protection of the generally very sensitive cells from weathering effects.

A special field of photovoltaics is so-called "concentrator photovoltaics" in which sunlight is concentrated by an optical system (e.g. lens, mirror) and the concentrated light beam impinges—according to the type of plant—on a relatively small solar cell.

For this purpose, the cell must be positioned exactly in the focus of the lens. Due to the small size of the cells, frequently special contacting methods (e.g. bonding) are necessary in order to contact the cells. These methods are however frequently unsuitable also for wiring up the different cells in the module. For this purpose, further contacting steps are then necessary.

In concentrator photovoltaics, solar radiation is focused by lenses. By this very high energy densities are achieved on very small areas. Thus, solar energy at a multiple of 500 is achieved for example on a circle of 2 mm diameter. The radiation distribution hereby has a Gaussian distribution, as a result of which solar radiation which is concentrated by over a multiple of 2,000 appears in the centre of the focal spot (a region of approx. 0.3 mm diameter). Thus the solar cell must be mounted in direct contact with a heat sink. In order to prevent the formation of hot spots, the most important task of this heat sink is firstly the distribution of the corresponding lost energy in the lateral direction, i.e. in width, and also at the same time of course transmission to the underlying layers. In order to achieve this, the rear side of the solar cell is therefore connected, in prior art, to a metallic layer. In addition, the upper side of the solar cell must be contacted as second electrical terminal. This contacting is thereby undertaken by means of the same metallic layer which also produces the contacting of the solar cell underside. This layer must therefore be structured in various electrically (and hence also mechanically and thermally) separated regions. This takes place by removing copper in specific regions so that regions which are electrically insulated from each other are produced.

FIG. 1 shows a solar cell according to the state of the art. This has a substrate (module base, glass carrier) 1 on which a copper plate 3a is applied by means of an adhesive layer 2a. A solar cell 5a is placed on this copper plate by means of an electrically conductive adhesive layer 4a. By means of the electrically conductive contacting of the solar cell 5a with the copper plate 3a, the solar cell is contacted on its rear side contact, here its positive terminal. Offset laterally relative to the solar cell 5a, there is disposed an insulating layer 6 which can for example consist of a glass fibre composite material. This insulating layer 6 has an electrically conductive gold layer 7 on its side orientated away from the substrate 1. The gold layer 7 is wired up electrically via a bonding wire 9 to a contact 11a as negative terminal of the solar cell.

In FIG. 1 in addition to the previously described arrangement of a solar cell which is laterally offset on the substrate, a second solar cell 5b is disposed in a corresponding manner. For serial wiring up of the two solar cells 5a and 5b, the gold layer 7 is wired up electrically to the copper layer 3b of the solar cell 5b via a connection 8b.

In order to produce a solar cell of this type, individually fitted copper plates 3a, 3b (so-called solar cell chips) are now mounted individually on the base plate 1 via an adhesive connection 2a. The solar cell 5a or 5b respectively must thereby be placed exactly so that the centre of the solar cell is located in the focal point of the lens fitted thereabove. The electrical connection 8b between the individual cells is effected only thereafter by soldering e.g. of a silver strip 8b. It is disadvantageous in this respect that a large number of individual parts is required, for which costs accrue in the supply and in the mounting and manufacturing logistics. During the assembly, a large number of different operating steps take place, such as for example preparation of the individual surfaces, application of joining materials, such as adhesives and solder, gripping and positioning the individual parts, curing the adhesive layers and also diverse soldering processes. In addition there are also process-associated steps. This large number of operating steps increases the cycle times and lowers the throughput of a manufacturing line for solar cell modules in concentrator photovoltaics. The material expenditure is also very high and incurs high costs.

In particular, some steps for producing the solar module are particularly expensive, such as for example the soldering processes. The material costs for the silver strips 8b for example are likewise very high.

SUMMARY OF THE INVENTION

It is therefore the object of the present invention to produce a solar cell module and also a method for the production thereof, with which solar cells can be produced reasonably and cheaply and precisely with respect to manufacturing technology, an excellent heat dissipation requiring to be ensured.

This object is achieved by the solar cell module by means of a solar cell module for concentrating solar systems with a plurality of solar cells which are disposed in a plane on a planar substrate, the solar cells having, on the substrate side, a first electrical contact and, on the side orientated away from the substrate, at least one second electrical contact, characterised in that the substrate is coated on the surface orientated towards the solar cells two-dimensionally with a metal layer, and the metal layer has: a plurality of planar portions which are assigned respectively to one solar cell, each portion of the metal layer having a first and at least a second region which are electrically insulated from each other and the first region extending under the assigned solar cell and contacting the first contact in an electrically conductive manner, and the second region being connected to the second contact of the solar cell in an electrically conductive manner, and also connecting portions between regions of adjacent portions. The object is also achieved by the method for the production of a solar cell module according to one of the preceding claims, characterised in that the surface of the planar substrate is coated with a metal layer, the metal layer being structured before or after the coating in order to form the large number of two dimensional portions and regions of the portions, a solar cell being disposed with its first electrical contact in electrical with the metal layer for each portion at predetermined positions on the metal layer and the second region being connected to the second electrical contact of the solar cell for each portion. Advantageous developments of the solar cell module according to the invention and of the method according to the invention are provided.

It is now crucial in the present invention that, during production of the module, individual fully contacted solar cell chips are not manufactured first of all and subsequently positioned individually but rather, in one operating step, the entire module surface is provided with a metal layer, for example a copper layer, which, on the one hand, provides the contacting of the solar cells both with respect to the negative and the positive terminal and, above all, facilitates positioning of the solar cells themselves. For this purpose, a planar, thin, for example 0.01 to 3 mm thick metal substrate, for example a copper foil, is structured by means of a suitable method, such as for example punching or laser beam cutting. This structured metal surface can be connected then to the module base (substrate). It is also possible firstly to apply a metal layer on the module base and thus to produce a laminate, for example a metal foil laminated on glass. The structuring can then be effected subsequently directly on the substrate. The structuring itself is possible as a result of all the conventional measures, such as for example etching methods or also laser machining.

There are suitable as metals for the metal layer or the metal foil advantageously all the metals which are used for heat-conducting foils, in particular copper, aluminium and/or alloys thereof.

With a solar module according to the present invention, the electrical contacting of the solar cells and also the electrical wiring up of the individual solar cells is ensured within the module. In addition, the solar cell is positioned exactly and permanently at a predetermined location within the module so that said solar cell is always positioned at the focal point of the concentrating optics. As a result of the large heat-conducting metal surface, the heat occurring in the solar cells is in addition dissipated very well so that overheating of the solar cells can be avoided. With the structure of the present invention, for example with only a very thin copper layer which is laminated on a glass carrier as substrate (with a thickness for example of merely 70 μm to 500 μm), the following functions can be fulfilled at the same time:
1. mechanical fixing of the cell
2. electrical contacting of the individual cells
3. electrical wiring up of the cells to each other
4. heat dissipation to the external air.

The metal surface can in addition be structured such that forces which occur as a result of the heat expansion of the various materials of substrate, metal and solar cell within the module are absorbed and if necessary also compensated for. Due to the metal surface, it is possible in addition to integrate jointly various electrical protective devices and supplementary functions, i.e. electrical circuits, directly during manufacture.

As a result of this particular procedure during production of the solar module, the logistical complexity in the operating preparation, storage and assembly is reduced significantly. The material use is likewise reduced so that overall a lower mechanical, personnel and financial complexity is required.

In addition, it has become possible for the first time as a result of the present invention to use printed circuit board technologies, lamination technology and lead-frame technology which are already used as standard in the electronics industry to produce solar modules. Fitting a solar module according to the invention with solar cells, protective circuits and the like can now therefore be achieved with standard technology.

By using adjustment marks which are structured into the metal surface, it is possible in addition further to standardise and make precise the positioning of solar cells and other electronic components.

Since the position of the individual solar cells on the metal surface or metal foil is fixed relative to each other by the continuous metal surface, merely only one single adjustment step is required in order to position the concentrating lens system, for example a collimator lens array, relative to the solar cells.

The solar cell module according to the invention advantageously has a large number of further features which are enumerated subsequently at the positions at which the focal point of the concentrating optical system forms, there is situated the space provided for receiving the solar cell. at these positions, the solar cell is positioned with high precision during the fitting process, and the rear-side contact (positive terminal or negative terminal) of the solar cell is connected electrically to the metal substrate. for easier positioning of the cell, the structuring of the metal substrate can include the formation of positioning marks. in order to dissipate the current from the surface (negative terminal) of the solar cell, the metal substrate has one or more contact fingers per cell which terminate in the vicinity of the chip. the contact fingers are ideally guided radially and/or as very narrow strip conductors to the cell in order to disturb the heat dissipation from the cell centre as little as possible. Advantageously, the contact surfaces taper towards the solar cell in order to achieve maximum stability and electrical conductivity, on the one hand, and, on the other hand, to impede the lateral heat dissipation directly at the solar cell as little as possible, i.e. keeping space for a wide rear-side contact of the solar cell. the contact fingers can terminate at a specific distance from the cell. Thereby, it is possible to keep the bonding wire sufficiently short but also, at the same time, to take variations in the localisation of the focal points into account after structuring of the metal substrate, and to place the cell in a correspondingly offset manner. In addition, the heat transfer is improved with a suitable spacing since more surface is available for the rear-side contact. the tips of the contact fingers can be coated locally with a suitable material (formation of so-called pads) in order to enable better contacting by bonding. There is suitable for this in particular partial gold-coating, e.g. made of a 1 to 6 μm thick nickel layer followed by a 0.5 to 5 μm thick gold layer. the tips of the contact fingers are connected by a thin wire ("wire bonding") to the second contact, e.g. on the upper side of the solar cell. The second contact is then configured in an opposite-terminal manner to the first contact or rear-side contact as negative terminal or positive terminal of the solar cell. the metal substrate has zones which are connected directly to the negative terminal of the solar cell and such that are connected directly to the positive terminal. in order to achieve a series circuit, respectively opposite zones of adjacent chips are connected to each other in order to achieve a parallel circuit, like zones of adjacent chips are connected to each other. depending on the application purpose, a plurality of cells are connected together. With a corresponding size of the metal surface, all the cells of one module can be produced on one surface or also only individual cells can be combined to form blocks which are then connected to each other in a conventional manner.

A few examples of solar cell modules according to the invention are now provided subsequently. Identical or similar reference numbers are thereby used for identical and similar elements.

DETAILED DESCRIPTION

Figure 1:
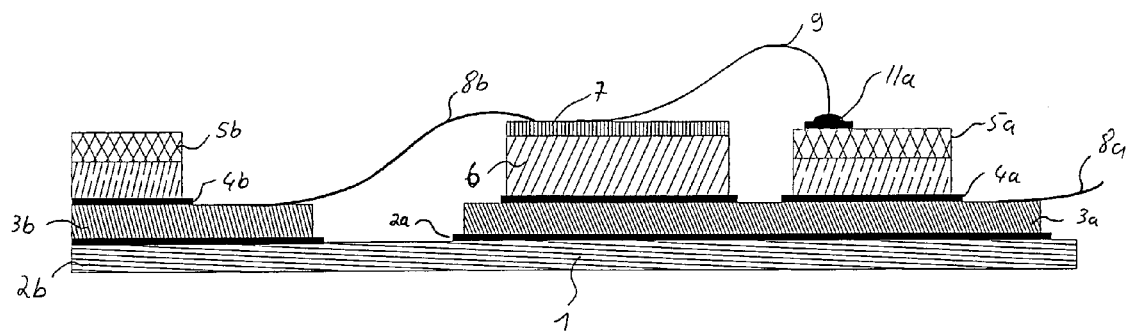
FIG. 1 shows a section of a conventional solar cell module with a mounted solar cell chip.
Figure 2:
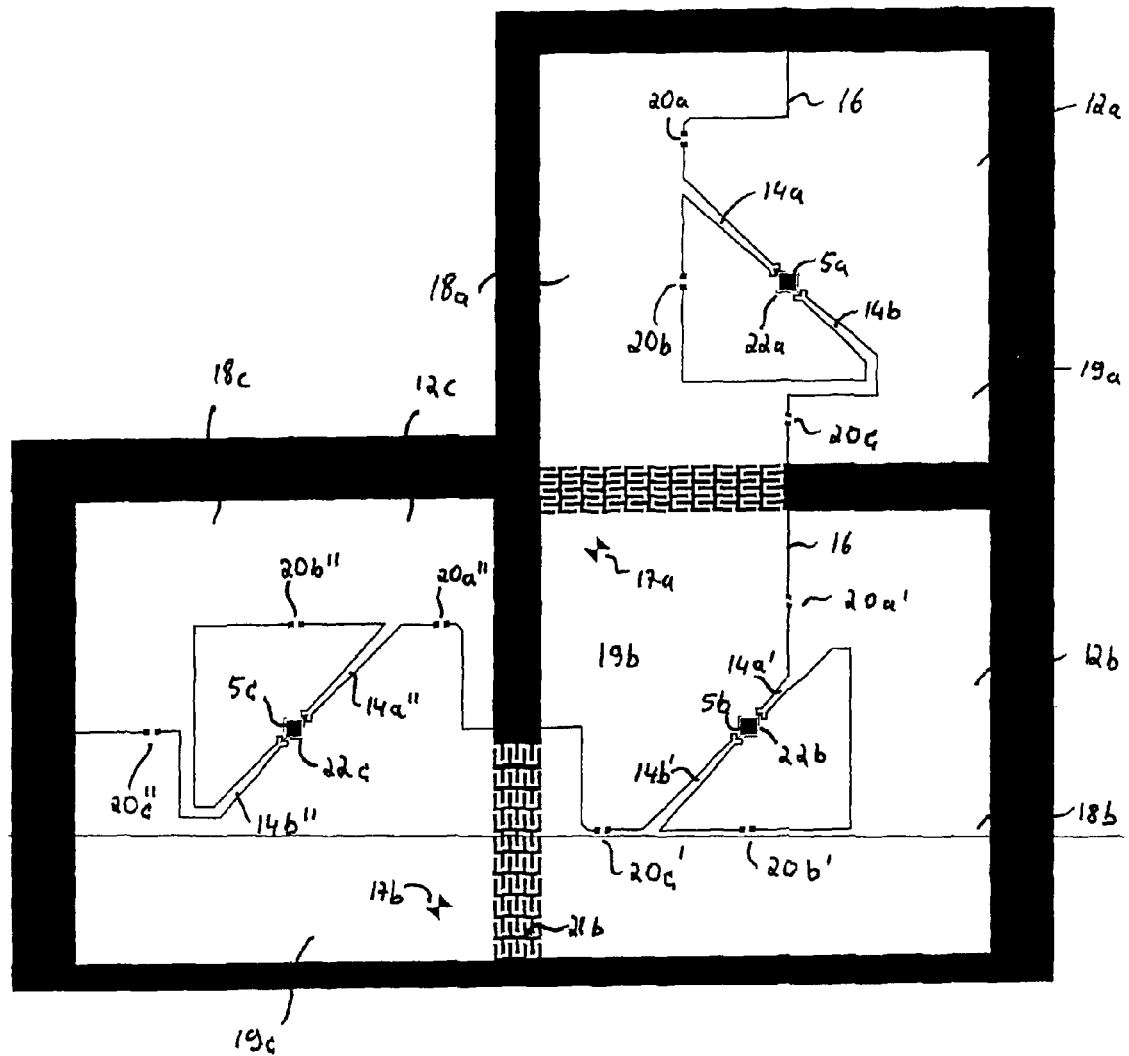
FIG. 2 shows a section of a module according to the invention.

FIG. 2 shows a section of a solar module according to the present invention. The present invention concerns solar cell modules for concentrating solar systems. The sunlight is hereby focused with the help of an optics on a tiny focal spot in which then only one small solar cell is situated. The solar cell modules according to the invention now consist of a planar, two-dimensional array comprising corresponding concentrator optics which produce a two-dimensional array of focal spots. A solar cell is now disposed in each focal spot. This has the advantage that highly efficient solar cells can be used in the concentrating solar technology. Hence an array of Fresnel lenses is used for example in so-called Flatcon™ technology, said lenses concentrating the sunlight by a factor of 300 to 1,000 and focusing on a small focal spot. In each focal spot of each individual Fresnel lens there is then situated a 1 to 10 mm² small solar cell. Hence overall expensive semiconductor surface of highly efficient solar cells, for example of III-V stacked cells, can be replaced by a comparatively cheap lens system. In addition, the degree of efficiency of a solar cell rises logarithmically with the concentration of the sunlight so that the concentrator solar technology makes higher efficiencies possible than conventional solar technology.

In FIG. 2, a plan view on three elements of an arrangement of solar cells on a substrate of such a solar cell module is now represented. The black areas are thereby non-conductive regions, whilst the white areas are conductive copper layers. In particular, the copper layer is structured by means of grooves 16 so that regions 18a to 18c or 19a to 19c which are electrically insulated from each other are produced.

In the centre of each portion 12a to 12c respectively one solar cell 5a to 5c is disposed. The arrangement of the solar cell is thereby effected within an adjustment or compensation region 21a to 21c. As can be seen, the rear side or underside of the solar cell 5a contacts, in portion 12a (and as subsequently always also the corresponding solar cells 5b and 5c, the corresponding elements in their respective regions) the copper surface in the region 19a. This surface 19a represents a positive terminal. The surface 19a thereby contacts the solar cell 5a on the rear side over a very large area so that the heat produced in the solar cell 5a can be dissipated and distributed outstandingly. The surface 19a is thereby reduced merely by two contact fingers 14a, 14b which contact the negative terminal of the solar cell 5a on the upper surface thereof by means of a bonding wire, not shown here. Further contacting of the solar cell is also possible via the fingers.

As can be detected in FIG. 2, the grooves 16 are interrupted by punch marks 20a, 20b, 20c so that, during the manufacturing process, another mechanical connection and hence also electrical contacting between the negative terminal 18a and the positive terminal 19a is present here. Punch marks of this type are required in order to obtain a copper foil which is mechanically continuous over all the portions 12a to 12c, said copper foil being able to be applied to a substrate, connected to one piece. After applying the copper foil, the punch marks 20a, 20b, 20c are then separated for example by means of a laser so that electrical insulation between the regions 18a and 19a is effected. The use of punch marks (connecting webs) make it possible to structure the copper layer even before application to the substrate. As a result, in addition to the structuring, e.g. etching, from one side of the copper layer, also structuring from both sides becomes possible. If for example separating grooves are etched from both sides, then their width can be kept significantly smaller than when etching only from one side. The width of the insulation grooves can hence be reduced (e.g. halved) and hence the copper layer remaining for the heat dissipation can be also extended.

In the present example, the regions 19a, 18b and 19c are connected to each other electrically via meandering structures 21a and 21b. The regions 18a, 19b and 18c are connected to each other electrically in the same manner. This means that the positive terminal 19a of the solar cell is connected via the contact finger 14a' to the negative terminal of the solar cell 5b and the positive terminal of the solar cell 5b via the region 19b and the contact finger 14a" to the negative terminal of the solar cell 5c. This is therefore a serial wiring up of the solar cells 5a, 5b and 5c.

The meandering structures 21a and 21b separate the individual portions 12a, 12b and 12c from each other and ensure mechanical compensation between the individual portions 12a to 12c and hence compensation for different heat expansions of the individual portions 12a, 12b and 12c.

Furthermore, it can be detected in FIG. 2 that positioning marks 17a and 17b are disposed in the portions 2b and 2c which make possible precise and automatic fitting of the individual portions 12a to 12c with the solar cells 5a to 5c.

Figure 3:
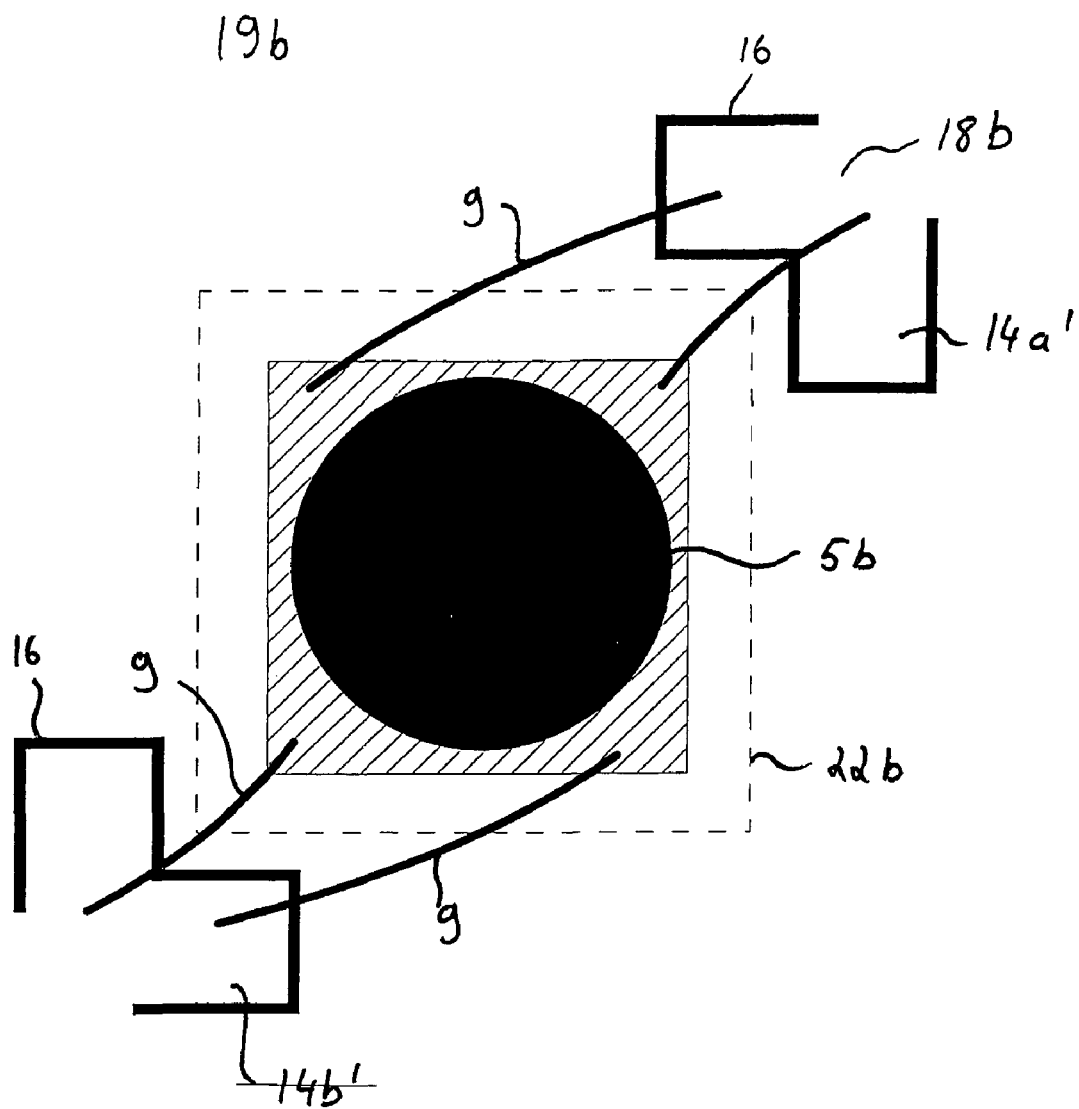
FIG. 3 shows a further enlarged section of a solar cell module according to FIG. 2.

FIG. 3 now shows a section from the portion 12b in FIG. 2. The ends of the fingers 14a' and 14b' which are orientated towards the solar cell 5b can be detected. The solar cell 5b is disposed within a marked adjustment region 22b and connected via bonding wires 9 to the fingers 14a' and 14b'.

Figure 4:
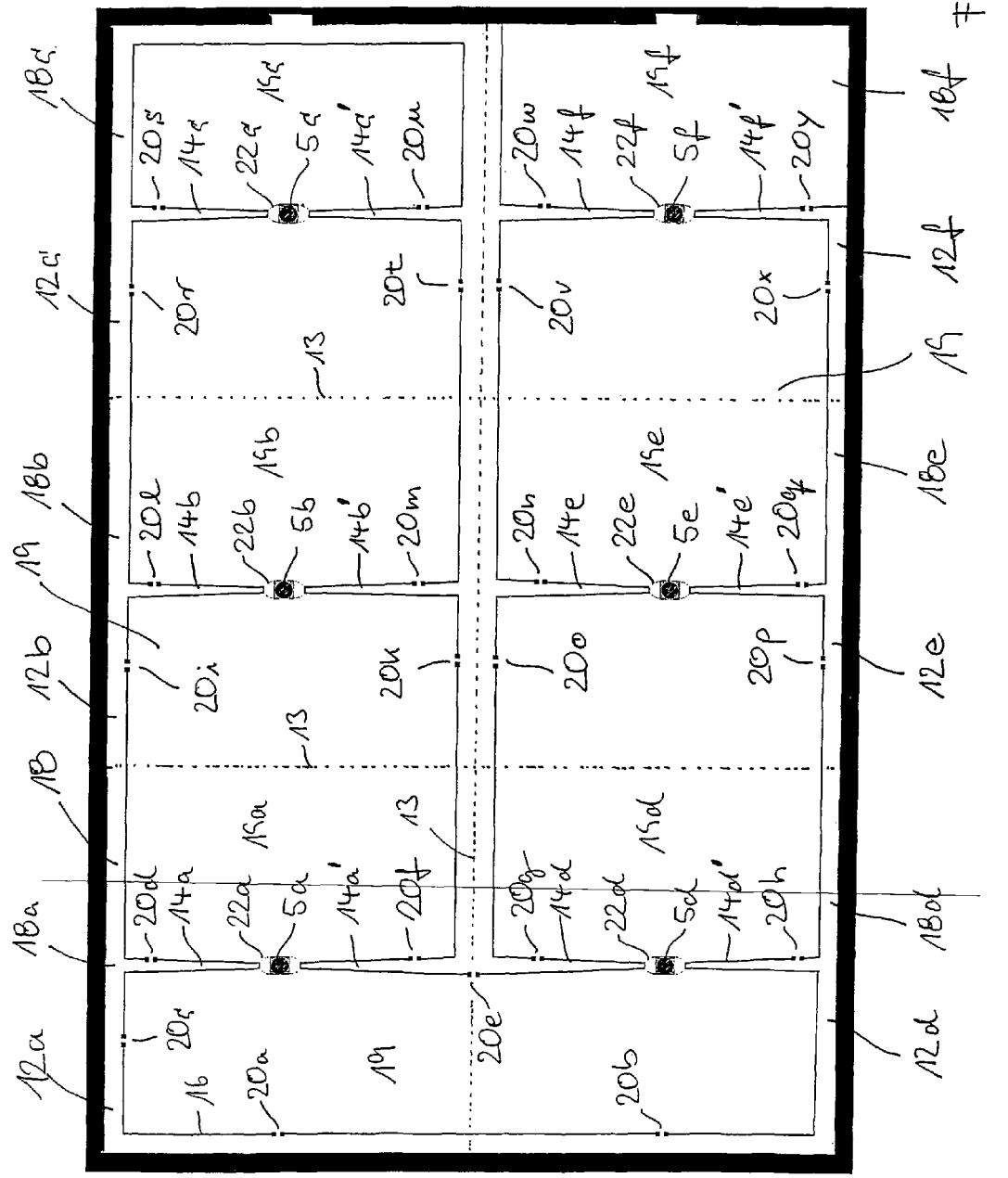
FIGS. 4 to 6 show the construction of further solar cell modules.

FIG. 4 now shows a solar cell module according to the invention in which the punch marks 20a to 20y have not yet been broken through. Punch marks of this type, as already described, are required if the foil is structured before application on the substrate. If the foil is structured only in the state when laminated with the substrate, punch marks of this type are unnecessary.

In FIG. 4, a module consisting of an arrangement of 2 times 3 solar cells 5a to 5f is represented. This solar cell module, the copper surface of which is represented without representing the concentrating Fresnel lenses situated above the drawing plane, is consequently subdivided into six portions 12a to 12f, the broken separating lines 13 between the portions 12a to 12f being illustrated merely for better understanding of the invention in FIG. 4. The broken lines 13 cannot be detected on the actual module.

In the present case, all the undersides of the solar cells 5a to 5f, i.e. all the positive terminals, are now connected to each other via the surfaces 19a to 19f which form a uniform surface 19. The surfaces 18a to 18f which form a uniform surface 18 including the fingers 14a to 14f are connected likewise to each other in an electrically conductive manner. The array present in FIG. 4 therefore concerns a parallel circuit of the solar cells 5a to 5f.

Figure 5:
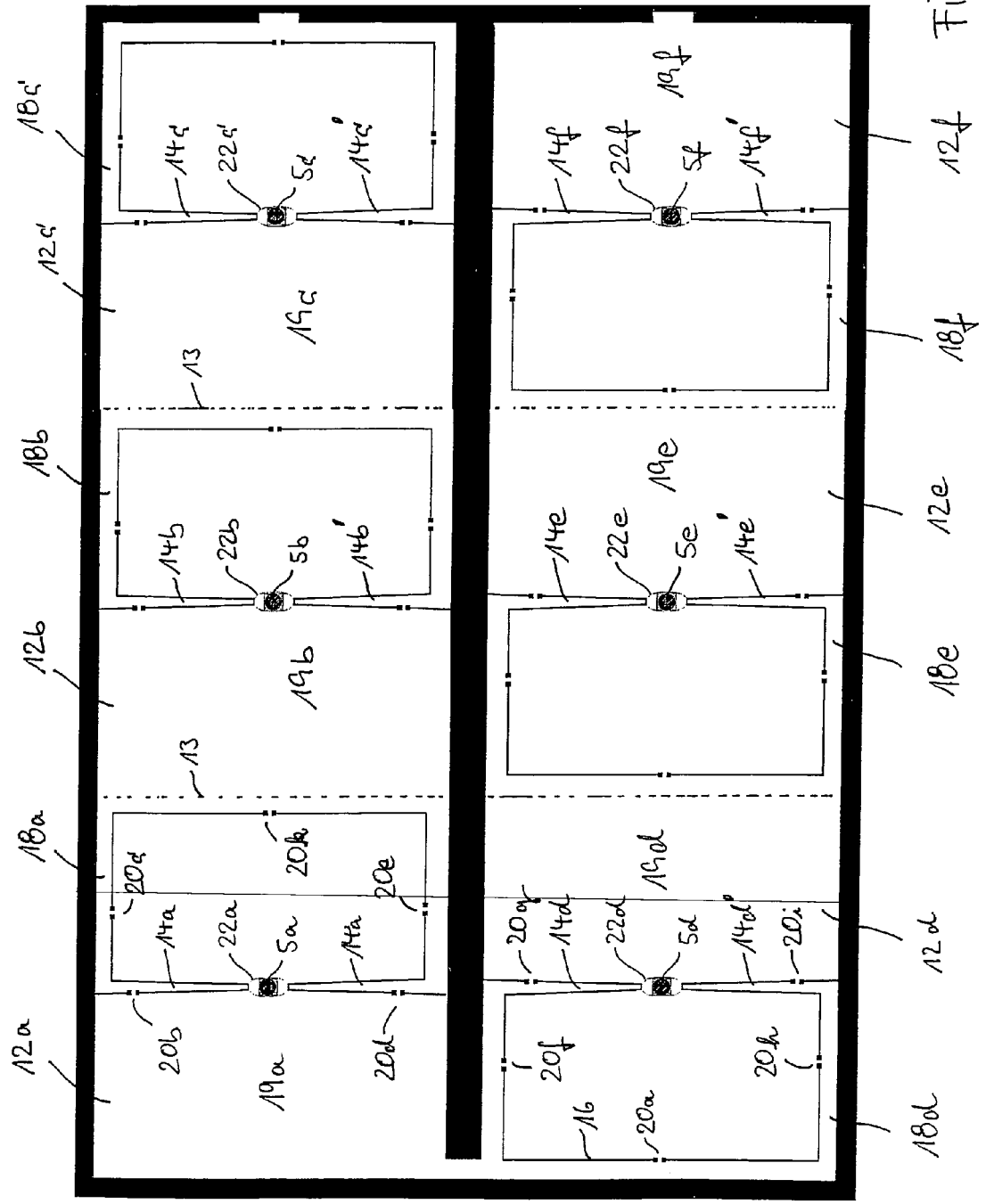

In FIG. 5, an array of 2 times 3 solar cells 5a to 5f, corresponding to FIG. 4, is represented, now however a serial wiring up being produced. The lines 13 for subdividing the module into individual portions 12a to 12f are illustrated here also merely for better understanding. Here as in all the other Figures, conductive copper surfaces are represented in white and non-conductive regions in black. In FIG. 5, a serial wiring up is now involved since the respective fingers 14 of the one solar cell are connected to the rear side of the next solar cell in an electrically conductive manner.

Figure 6:
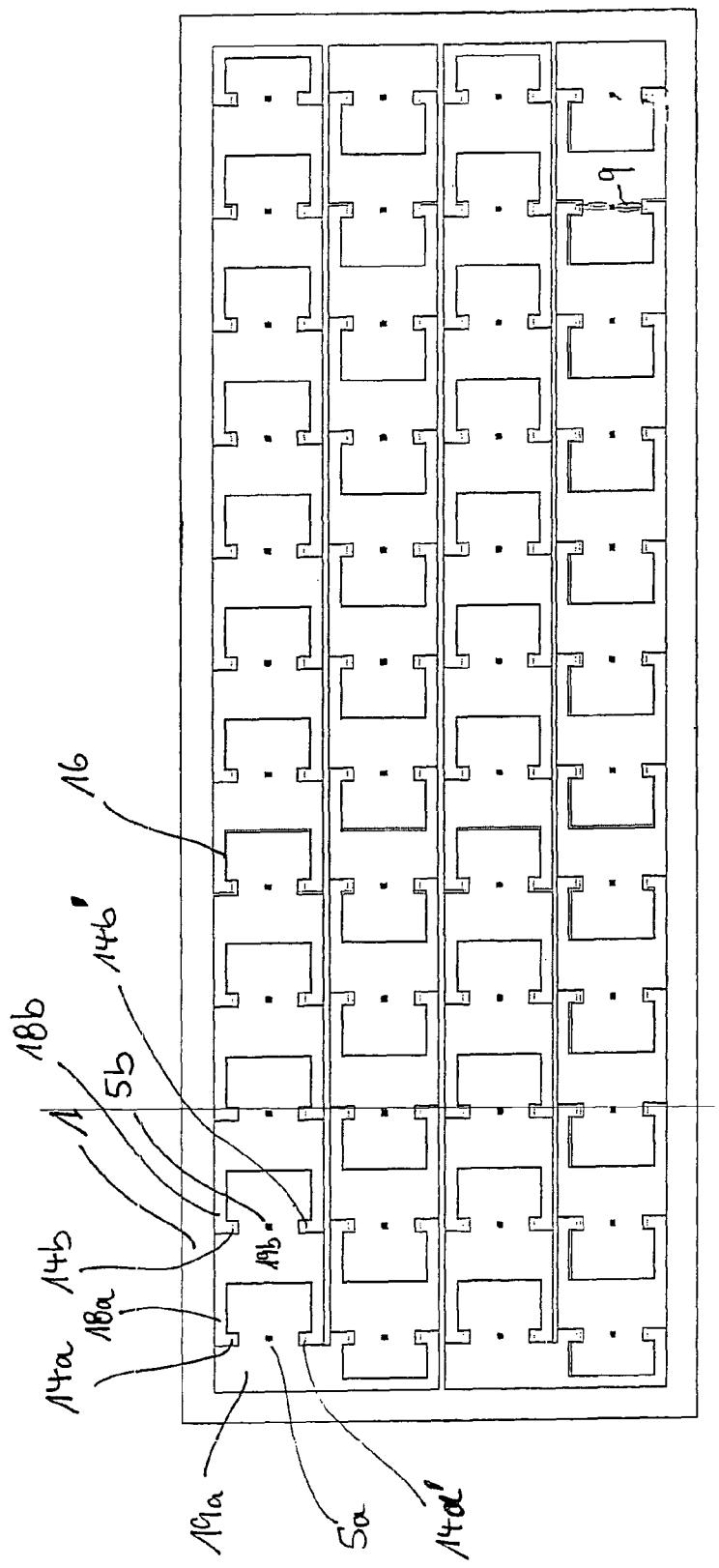

FIG. 6 also shows a further embodiment of a serial wiring up within one solar cell module comprising 4 times 12 solar cells 5. However merely the first solar cells have been provided hereby with reference numbers.

It can be detected that the fingers 14 are again connected via the surface 18 to the surface 19 of the subsequent solar cell and hence to the positive terminal thereof. The fingers 14 here have a shorter configuration so that the bonding wires illustrated in this Figure need to be longer than in the embodiments of FIGS. 4 and 5 merely in the case of the second last solar cell.

Figure 7:
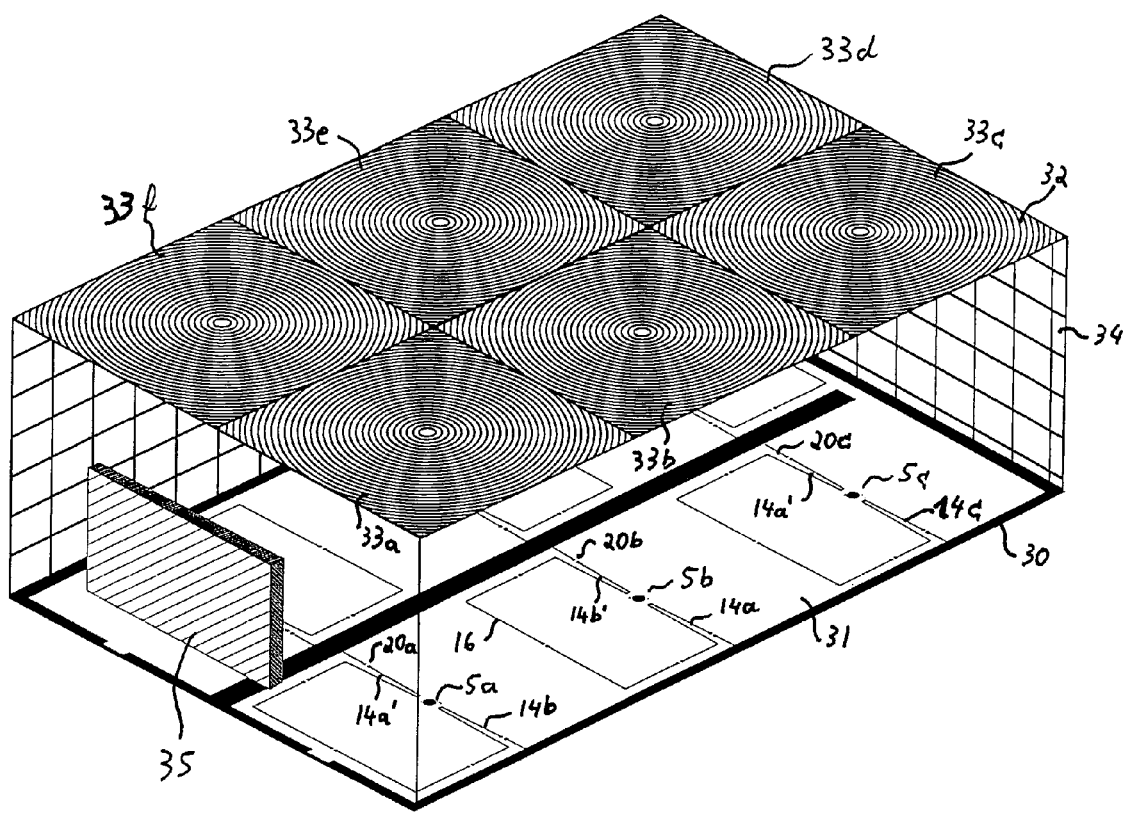
FIG. 7 shows a complete solar module with a concentrator optics.

FIG. 7 shows a complete solar module with a concentrator lens system according to the present invention. This solar module has a substrate 30 on which a copper foil 31 is disposed. On this copper foil, solar cells 5a, 5b, 5c etc. are disposed wired up serially. The construction and the structuring of the copper foil correspond more extensively to those which are shown in FIG. 5, The regions on the substrate 30 illustrated in black (with the exception of the solar cells 5a, 5b, 5c etc.) are non-conductive regions on which no copper foil is present. The copper foil 31 has, for its part, grooves 16 which structure it such that a serial wiring up is produced, beginning with the solar cell 5a, via the solar cell 5b and 5c and the solar cells which are disposed in parallel thereto and are partially concealed in the drawing.

The solar module has in addition a cover 32 which has in total six Fresnel lenses 33a to 33f which are disposed adjacently in such a manner that the focal points of these Fresnel lenses 33a to 33f respectively are focused on the solar cells 5a, 5b, 5c etc. The cover 32 with the Fresnel lenses 33a to 33f is configured in one piece and is produced for example from a plastic material in the injection moulding process. In order to produce the solar module according to the invention, it is therefore necessary merely to position the cover 32 correctly relative to the substrate 30. This requires only a single positioning step. The cover 32 is at a spacing from the substrate 30 via walls 34. The walls 34 also serve to seal the interior of the solar module hermetically so that the latter can be neither soiled nor damaged in another manner in the interior thereof. In addition, as in the present example, an inspection opening with a cover 35, can be provided in one of the side walls.

It is therefore possible for the first time with the present invention to manufacture large-area modules for concentrator photovoltaics in an economical and precise manner.

The invention claimed is:

1. A solar cell module for concentrating solar systems, the solar cell module comprising:
   a plurality of solar cells disposed in a plane on a planar substrate, the solar cells having, on the substrate side, a first electrical contact, and, on the side orientated away from the substrate, at least one second electrical contact, wherein the substrate is coated on the surface orientated towards the solar cells two-dimensionally with a metal layer, and
   the metal layer has:
   a) a plurality of planar portions which are assigned respectively to one solar cell, each portion of the metal layer having a first and at least a second region, the metal layer including grooves configured to produce the first and second regions and configured to electrically insulate the first and second regions from each other
   and the first region extending under the assigned solar cell and contacting the first contact in an electrically conductive manner, and
   the second region being connected to the second contact of the solar cell in an electrically conductive manner, and the second region having at least one contact finger, the at least one contact finger extending radially towards the solar cell and
   b) connecting portions between regions of adjacent portions.

2. The solar cell module according to claim 1, wherein the grooves have a maximum width selected from the group including less than 1 mm, less than 0.5 mm, and less than 01 mm.

3. The solar module according to claim 2, wherein the connecting portions have compensation structures for compensating for material stresses between the substrate and the metal layer.

4. The solar module according to claim 1, the connecting portions have meandering or interleaved T-structures at least partially between the regions to be connected.

5. The solar module according to one claim 1, wherein the connecting portions respectively connect a first region of a portion to respectively a first region of one or more adjacent portions.

6. The solar module according to claim 1, wherein the connecting portions respectively connect a first region of a portion to at least one second portion of an adjacent portion.

7. The solar module according to claim 1, wherein the metal layer covers a percentage of the surface of the substrate selected from the group including greater than 50% greater than 80%, greater than 90%, and greater than 95%.

8. The solar cell module according to claim 1, wherein the metal layer covers the substrate completely, with the exception of a circumferential edge of at least one of the substrate and the grooves.

9. The solar cell module according to claim 1, wherein the metal layer comprises at least one of copper, aluminum, an aluminum alloy and a copper foil.

10. The solar cell module according to claim 1, wherein the metal layer comprises a copper foil with a thickness selected from the group including above 0.01 mm and less than 3 mm, above 35 μm and less than 900 μm, above 70 μm and less than 500 μm at least in regions.

11. The solar cell module according to claim 1, wherein the metal layer is laminated onto the substrate.

12. The solar cell module according to claim 1, wherein the substrate is made of glass or glass fibre composite material at least in regions.

13. The solar cell module according to claim 1, wherein protective diodes, are disposed on the substrate.

14. The solar cell module according to claim 1, wherein the metal layer has electrical line structures, including at least one of data lines, in lines, and out lines to further electrical components disposed on the substrate.

15. The solar cell module according to claim 1, wherein the metal layer has at least one of positioning markings and punch marks.

16. The solar cell module according to wherein light collecting devices, at a spacing from the surface of the substrate, are disposed such a that a solar cell is disposed at the focal point of each light collecting device.

17. The solar cell module according to claim 16, wherein the light collecting device comprises a collimator lens.

18. The solar cell module according to claim 16, wherein the light collecting device contains a Fresnel lens.

19. The solar cell module according to claim 1, wherein the first region contacting a solar cell forms a continuous metal surface which extends on at least one side of the solar cell at an opening angle, wherein the opening angle is at least one of greater than 30°, greater than 45°, greater than 90°, and greater than 120°, viewed from the position of the solar cell.

20. The solar cell module according to claim 1, wherein the at least one contact finger of the second region extends at an opening angle selected from the group consisting of less than 30° and less than 10°, viewed from the position of the solar cell.

21. The solar cell .module according to claim 1, wherein the at least one contact finger of the second region has, at least on its end orientated towards the solar cell or at least in a section along the finger having a length of at least 5 mm, at least a width of < one of less than 2 mm and less than 1 mm.

22. A method for the production of a solar cell module and comprising the steps of:
   coating a surface of a planar substrate with a metal layer,
   structuring the metal layer at least one of before and after the coating step in order to form a plurality of planar portions and first and second regions of the portions, and
   disposing a solar cell with a first electrical contact in electrical contact with the metal layer for each portion at predetermined positions on the metal layer and
   connecting the second region to a second electrical contact of the solar cell for each portion;
   thereby providing the solar cell module of claim 1.

23. The method according to claim 22, further comprising the step of producing grooves in the metal layer for structuring the metal layer.

24. The method according to claim 22, wherein the structuring of the metal layer is effected by at least one of photolithographic etching, punching and laser cutting.

25. The method according to claim 22 wherein the step of structuring the metal layer before the coating the step includes steps of:
   coating the surface with the metal layer between the individual regions or portions at predetermined positions, to form connecting webs between adjacent regions or portions as punch markings and
   severing the connecting webs after coating of the surface of the substrate with the metal layer.

26. The method according to claim 22, further comprising the steps of structuring position markings into the metal layer and the solar cell and positioning electronic components taking into account the position markings.

* * * * *